US012322629B2

(12) United States Patent
Horiuchi et al.

(10) Patent No.: US 12,322,629 B2
(45) Date of Patent: Jun. 3, 2025

(54) TRANSFER APPARATUS AND TRANSFER METHOD

(71) Applicant: Tokyo Electron Limited, Tokyo (JP)

(72) Inventors: Tomonori Horiuchi, Nirasaki (JP); Dongwei Li, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 905 days.

(21) Appl. No.: 17/446,739

(22) Filed: Sep. 2, 2021

(65) Prior Publication Data

US 2022/0076977 A1  Mar. 10, 2022

(30) Foreign Application Priority Data

Sep. 10, 2020  (JP) ................................ 2020-151787

(51) Int. Cl.
*H01L 21/677* (2006.01)
*B25J 11/00* (2006.01)
(Continued)

(52) U.S. Cl.
CPC ..... *H01L 21/67754* (2013.01); *B25J 11/0095* (2013.01); *B25J 15/0052* (2013.01); *B65G 49/061* (2013.01); *B65G 49/067* (2013.01); *H01L 21/67196* (2013.01); *H01L 21/67259* (2013.01); *H01L 21/67742* (2013.01);
(Continued)

(58) Field of Classification Search
CPC ........ H01L 21/67754; H01L 2167/259; B65G 49/067; G01N 21/4738
See application file for complete search history.

(56) References Cited

U.S. PATENT DOCUMENTS

2004/0253828 A1* 12/2004 Ozawa ............. H01L 21/76826
257/E21.279
2015/0062582 A1*  3/2015 Adachi ................. G01B 11/06
399/45

FOREIGN PATENT DOCUMENTS

JP   H06-034253 U    5/1994
JP   2546367 B2 * 10/1996
(Continued)

OTHER PUBLICATIONS

JP-2004-234274 (Aug. 2004) Device for Discriminating Authenticity of Paper Sheets, Okuna Kenji et al.*
(Continued)

*Primary Examiner* — Ernesto A Suarez
*Assistant Examiner* — Laurence R Brothers
(74) *Attorney, Agent, or Firm* — Armstrong Teasdale LLP

(57) ABSTRACT

A transfer apparatus transfers a first substrate and a second substrate while holding the first substrate and the second substrate to overlap each other in a plan view. The transfer apparatus includes: a first holding arm configured to hold the first substrate in a horizontal direction; a second holding arm configured to hold the second substrate in the horizontal direction; a first detection sensor configured to detect presence/absence of the first substrate held by the first holding arm; and a second detection sensor configured to detect presence/absence of the second substrate held by the second holding arm, wherein the first detection sensor includes a sensor configured to detect the presence/absence of the first substrate, and wherein the first holding arm includes a notch formed at least at an inner end portion of a tip of the first holding arm and configured to allow the optical axis to pass therethrough.

13 Claims, 11 Drawing Sheets

(51) Int. Cl.
  *B25J 15/00*    (2006.01)
  *B65G 49/06*    (2006.01)
  *H01L 21/67*    (2006.01)
  *H01L 21/687*   (2006.01)

(52) U.S. Cl.
  CPC .. *H01L 21/67745* (2013.01); *H01L 21/68707* (2013.01); *B65G 2203/0233* (2013.01); *B65G 2203/044* (2013.01)

(56) References Cited

FOREIGN PATENT DOCUMENTS

| | | | |
|---|---:|---|---|
| JP | 10163294 | A * | 6/1998 |
| JP | H11-040647 | A | 2/1999 |
| JP | H11-214481 | A | 8/1999 |
| JP | 2004234274 | A * | 8/2004 |
| JP | 2010103252 | A * | 5/2010 |
| KR | 10-2005-0098581 | A | 10/2005 |

OTHER PUBLICATIONS

JP-2546367 (Oct. 1996) Wafer Detection Method, Oomori Noryo.*
JP H10163294 (Jun. 1998).*

* cited by examiner

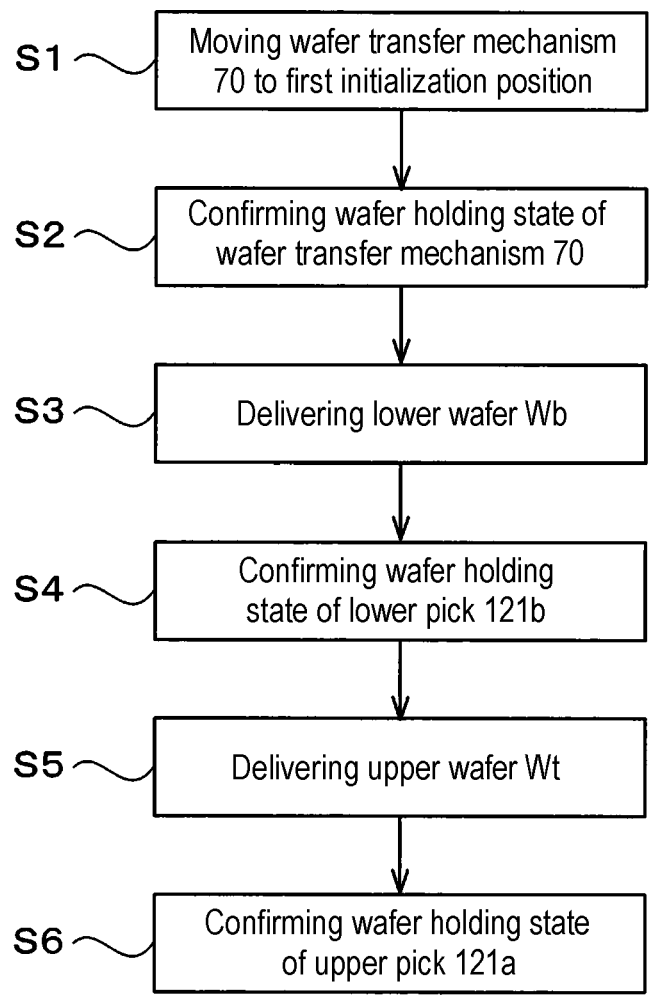

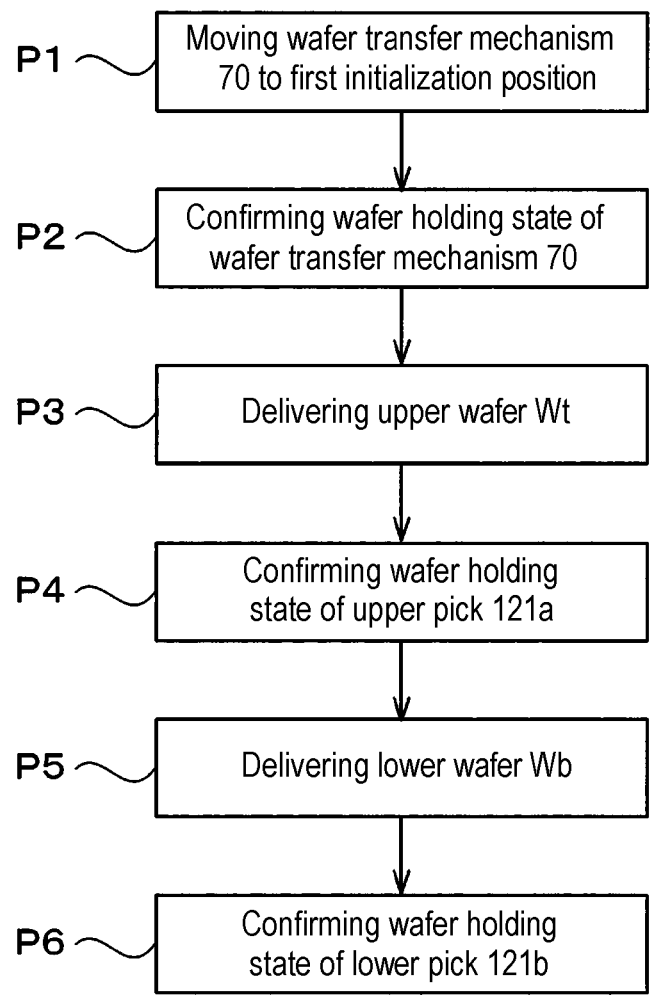

TRANSFER APPARATUS AND TRANSFER METHOD

CROSS-REFERENCE TO RELATED APPLICATION

This application is based upon and claims the benefit of priority from Japanese Patent Application No. 2020-151787, filed on Sep. 10, 2020, the entire contents of which are incorporated herein by reference.

TECHNICAL FIELD

The present disclosure relates to a transfer apparatus and a transfer method.

BACKGROUND

Patent Document 1 discloses a plasma processing system including: a housing including therein a transfer apparatus configured to load/unload a workpiece, an accommodation part attached to a side surface of the housing and accommodating the workpiece therein, and a plasma processing apparatus configured to process the workpiece. According to the plasma processing system described in Patent Document 1, windows are formed at positions facing each other on the top surface and the bottom surface of the housing, and an optical element sensor configured to detect the presence/absence of the workpiece is disposed on each of the facing windows outside the housing.

PRIOR ART DOCUMENT

Patent Document

Patent Document 1: Japanese Laid-Open Utility Model Publication No. 6-34253

SUMMARY

According to one embodiment of the present disclosure, there is provided a transfer apparatus that transfers a first substrate and a second substrate while holding the first substrate and the second substrate to overlap each other in a plan view. The transfer apparatus includes: a first holding arm configured to hold the first substrate in a horizontal direction; a second holding arm configured to hold the second substrate in the horizontal direction; a first detection sensor configured to detect presence/absence of the first substrate held by the first holding arm; and a second detection sensor configured to detect presence/absence of the second substrate held by the second holding arm, wherein at least the first detection sensor includes a sensor configured to detect the presence/absence of the first substrate by projecting an optical axis based on the second holding arm as a reference surface and detecting a difference in a light-receiving position between a diffused and reflected light beam from the reference surface and a diffused and reflected light beam from the substrate, and the first holding arm includes a notch formed at least at an inner end portion of a tip of the first holding arm and configured to allow the optical axis projected to the second holding arm to pass therethrough.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a flowchart illustrating main steps of a wafer transfer method according to an embodiment.

FIG. 8 is a flowchart illustrating main steps of a wafer transfer method according to an embodiment.

DETAILED DESCRIPTION

Figure 1:
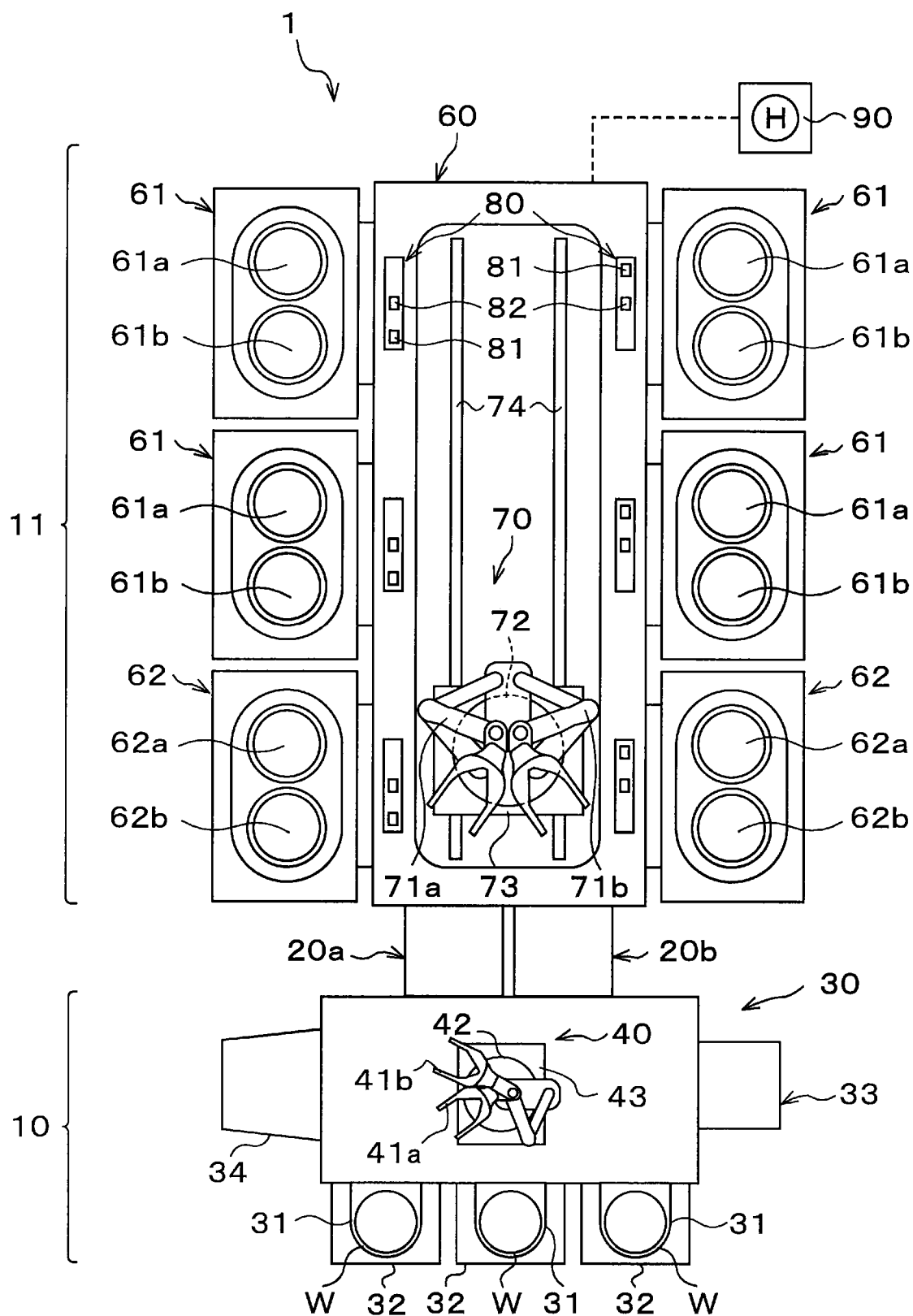
FIG. 1 is a plan view schematically illustrating a configuration example of a vacuum processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

For example, in a semiconductor device manufacturing process, in the state in which a process module accommodating a semiconductor wafer (substrate) (which may be referred to as a "wafer" below) is decompressed, various predetermined processing steps are implemented on the wafer. These processing steps are performed using a vacuum processing apparatus equipped with a plurality of process modules, and in the vacuum processing apparatus, in order to shorten the time required for transferring wafers, a plurality of (e.g., two wafers) wafers are vertically arranged and mounted by a transfer arm and simultaneously transferred.

When a plurality of wafers are simultaneously transferred in this way, in order to appropriately load/unload the wafers into/from respective process modules, it is required to individually specify and detect the presence/absence of each wafer mounted on the transfer arm.

The plasma processing system described in Patent Document 1 described above projects light from the transmission-type sensors provided outside the housing via a transparent window to detect the presence/absence of a wafer held by a robot hand (transfer arm) inside the housing. However, as described above, in Patent Document 1, there is no description about individually specifying and detecting each of the plurality of substrates mounted on the transfer arm. In addition, it is difficult to individually detect the presence/absence of wafers using the transmission-type sensors disclosed in Patent Document 1 due to spatial restrictions, such as a sensor mounting position and a mounting angle. Thus, there was room for improvement in this respect.

The technique according to the present disclosure has been made in view of the above circumstances, and in a transfer apparatus configured to simultaneously transfer a plurality of substrates, the substrates held by the transfer apparatus are appropriately detected. Hereinafter, a vacuum processing apparatus provided with a transfer apparatus according to this embodiment will be described with reference to drawings. In this specification and the drawings, elements having substantially the same functional configurations will be denoted by the same reference numerals and redundant descriptions will be omitted.

<Vacuum Processing Apparatus>

First, the configuration of a vacuum processing apparatus will be described. FIG. 1 is a plan view schematically illustrating the outline of the configuration of a vacuum processing apparatus 1. In this embodiment, a case in which the vacuum processing apparatus 1 is provided with a chemical oxide removal (COR) module and a post heat treatment (PHT) module as process modules will be described as an example. In addition, the module configuration of the vacuum processing apparatus 1 of the present disclosure is not limited thereto and may be arbitrarily selected.

As illustrated in FIG. 1, the vacuum processing apparatus 1 includes a configuration in which an atmospheric part 10 and a decompression part 11 are integrally connected via load-lock modules 20a and 20b. The atmospheric part 10 includes a plurality of atmospheric modules configured to perform respective desired processes on wafers W under an atmospheric pressure atmosphere. The decompression part 11 includes a plurality of decompression modules configured to perform respective desired processes on wafers W under a decompressed atmosphere.

The load-lock module 20a temporarily holds wafers W in order to deliver the wafers W, which have been transferred from a loader module 30 to be described later in the atmospheric part 10, to a transfer module 60 to be described later in the decompressed part 11. The load-lock module 20a includes therein a plurality of (e.g., two) stockers (not illustrated) and simultaneously hold therein two wafers W using the stockers.

The load-lock module 20a is connected to the loader module 30 to be described later and the transfer module 60 to be described later via respective gates (not illustrated), which are provided with gate valves (not illustrated), respectively. These gate valves make it possible to achieve both airtightness between the load-lock module 20a, the loader module 30, and the transfer module 60, and communication therebetween.

A gas supplier (not illustrated) configured to supply a gas and an exhauster (not illustrated) configured to discharge the gas are connected to the load-lock module 20a, and the interior of the load-lock module 20a is configured to be switchable between an atmospheric pressure atmosphere and a decompressed atmosphere by the gas supplier and the exhauster. That is, the load-lock module 20a is configured to appropriately deliver wafers W between the atmospheric part 10 having the atmospheric pressure atmosphere and the decompression part 11 having the decompressed atmosphere.

The load-lock module 20b temporarily holds wafers W transferred from the transfer module 60 in order to hand over the wafers W to the loader module 30. The load-lock module 20b has the same configuration as the load-lock module 20a. That is, the load-lock module 20b includes gate valves (not illustrated), gates (not illustrated), a gas supplier (not illustrated), and an exhauster (not illustrated).

The number and arrangement of load-lock modules 20a and 20b are not limited to those of this embodiment, and may be arbitrarily set.

The atmospheric part 10 includes the loader module 30 including a wafer transfer mechanism 40, a load port 32 in which a FOUP 31 configured to store a plurality of wafers W is placed, a CST module 33 configured to cool the wafers W, and an orienter module 34 configured to adjust the horizontal orientation of the wafers W.

The loader module 30 includes a rectangular housing therein, and the interior of the housing is maintained in an atmospheric pressure atmosphere. A plurality of (e.g., three) load ports 32 are installed side by side on one side surface forming a long side of the housing of the loader module 30. The load-lock modules 20a and 20b are installed side by side on the other side surface forming another long side of the housing of the loader module 30. The CST module 33 is installed on one side surface forming a short side of the housing of the loader module 30. The orienter module 34 is installed on the other side surface forming a short side of the housing of the loader module 30.

The number and arrangement of the load ports 32, the CST module 33, and the orienter module 34 are not limited to those in this embodiment, and may be arbitrarily designed. In addition, the types of atmospheric modules provided in the atmospheric part 10 are not limited to this embodiment, and may be arbitrarily selected.

Each FOUP 31 accommodates a plurality of (e.g., 25) wafers W of one lot. In addition, the interiors of the FOUPs 31 placed in respective load ports 32 are filled with, for example, air or nitrogen gas and are sealed.

Inside the loader module 30, a wafer transfer mechanism 40 configured to transfer wafers W is provided. The wafer transfer mechanism 40 includes transfer arms 41a and 41b configured to hold and move wafers W, a turntable 42 configured to rotatably support the transfer arms 41a and 41b, and a rotary stage 43 on which the turntable 42 is mounted. The wafer transfer mechanism 40 is configured to be movable in the longitudinal direction inside the housing of the loader module 30.

The decompression part 11 includes a transfer module 60 configured to simultaneously transfer two wafers W to various process modules, a COR modules 61 configured to perform COR processing on the wafers W, and a PHT module 62 configured to perform PHT processing on the wafers W. The interior of each of the transfer module 60, the COR module 61, and PHT module 62 is maintained in a decompressed atmosphere. A plurality of (e.g., four) COR modules 61 and a plurality of (e.g., two) PHT modules 62 are provided for the transfer module 60.

The transfer module 60 as a transfer apparatus has a rectangular housing therein and is connected to the load-lock modules 20a and 20b via gate valves (not illustrated) as described above. The transfer module 60 sequentially transfers the wafers W carried into the load-lock module 20a to one COR module 61 and one PHT module 62 to be subjected to COR processing and PHT processing, and unloads the wafers W to the atmospheric part 10 via the load-lock module 20b.

Inside the COR module 61, two stages 61a and 61b on which two wafers W are placed side by side in the horizontal direction are installed. The COR module 61 simultaneously performs the COR processing on the two wafers W by placing the wafers W side by side on the stages 61a and 61b. In addition, the COR module 61 is connected to a gas supplier (not illustrated) configured to supply, for example, a processing gas or a purge gas, and an exhauster (not illustrated) configured to discharge the gas.

Inside the PHT module 62, two stages 62a and 62b on which two wafers W are placed side by side in the horizontal direction are installed. The PHT module 62 simultaneously performs the PHT processing on the two wafers W by placing the wafers W side by side on the stages 62a and 62b. In addition, the PHT module 62 is connected to a gas supplier (not illustrated) configured to supply, for example, a processing gas or a purge gas, and an exhauster (not illustrated) configured to discharge the gas.

In addition, each of the COR module 61 and the PHT module 62 is connected to the transfer module 60 through a gate (not illustrated) that is provided with a gate valve (not illustrated). This gate valve makes it possible to achieve both airtightness between the transfer module 60, the COR module 61, and the PHT module 62, and communication therebetween.

In addition, the number, arrangement, and type of process modules provided in the transfer module 60 are not limited to this embodiment and may be set arbitrarily.

Inside the transfer module 60, a wafer transfer mechanism 70 configured to transfer wafers W, is installed. The wafer transfer mechanism 70 includes transfer arms 71a and 71b configured to hold and move two wafers W to be vertically arranged, in other words, to overlap each other in a plan view, a turntable 72 configured to rotatably support the transfer arms 71a and 71b, and a rotary stage 73 on which the turntable 72 is mounted. In addition, inside the transfer module 60, guide rails 74, which extend in the longitudinal direction of the transfer module 60, are installed. The rotary stage 73 is installed on the guide rails 74 and configured to move the wafer transfer mechanism 70 along the guide rails 74.

Figure 2:
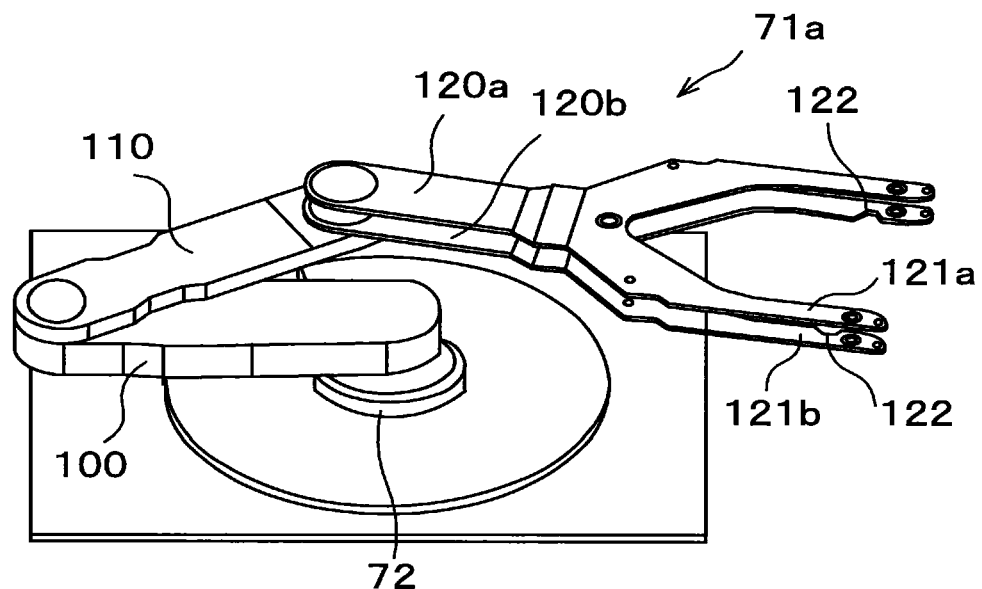
FIG. 2 is a perspective view illustrating a configuration example of a wafer transfer mechanism.

As illustrated in FIG. 2, the transfer arm 71a includes a first arm 100 having one end rotatably connected to the turntable 72, a second arm 110 having one end rotatably connected to the other end of the first arm 100, and a third arm 120a and a fourth arm 120b which are rotatably connected to the other end of the second arm 110. That is, the transfer arm 71a has a link arm structure in which three types of arms are connected with two axes.

In addition, an upper pick 121a and a lower pick 121b, each configured to hold a wafer W, are connected to the other ends of the third arm 120a and the fourth arm 120b, respectively. The transfer arm 71a holds two wafers W to overlap each other in a plan view using the upper pick 121a and the lower pick 121b, and simultaneously transfers the two wafers.

Figure 3:
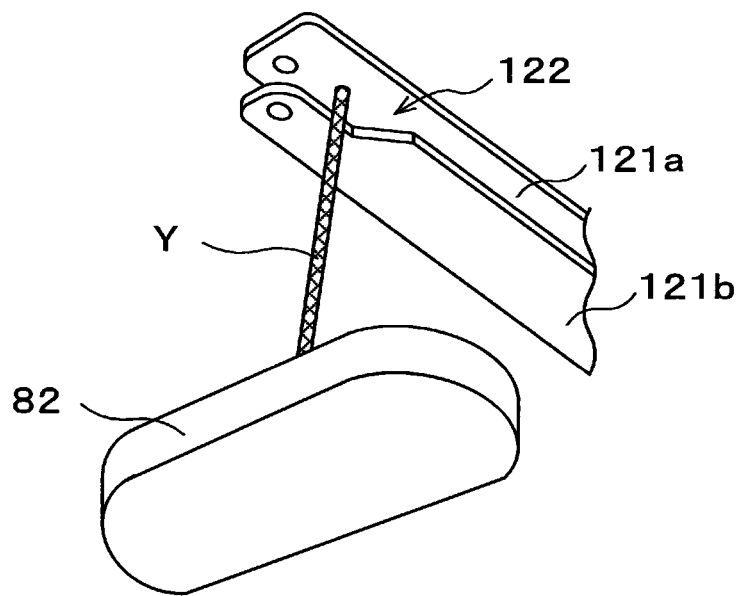
FIG. 3 is a perspective view illustrating an example in which a notch is formed in a lower pick.

In addition, as illustrated in FIGS. 2 and 3, a notch 122 through which an optical axis Y projected from a lower wafer detection sensor 82, which will be described later, passes is formed at the inner end portion of the tip of the lower pick 121b. As illustrated in FIG. 3, the shape of the notch 122 formed in the lower pick 121b is not particularly limited as long as the optical axis Y passing through the notch 122 can reach the rear surface of the upper pick 121a.

The transfer arm 71b has the same configuration as the transfer arm 71a. That is, the transfer arm 71b has a link arm structure in which three types of arms are connected with two axes, and is configured to be capable of holding two wafers W to overlap each other in a plan view and simultaneously transferring the two wafers W. In addition, a notch 122 is formed at the inner end portion of the tip of the lower pick 121b of the transfer arm 71b.

In the transfer module 60, the wafers W held in the load-lock module 20a are received by the transfer arm 71a and transferred to the COR module 61. In addition, the wafers W subjected to COR processing is held by the transfer arm 71a and transferred to the PHT module 62. In addition, the wafers W subjected to PHT processing are held by the transfer arm 71b and carried out to the load-lock module 20b.

In the following description, of the two wafers W held by the transfer arm 71a or the transfer arm 71b, the wafer held by the upper pick 121a may be referred to as an "upper wafer Wt" and the wafer held by the lower pick 121b may be referred to as a "lower wafer Wb".

In the decompression part 11, a plurality of wafer detection mechanisms 80 (in this example, six in total), each of which is capable of individually detecting two wafers W mounted on the wafer transfer mechanism 70 (each of the upper pick 121a and the lower pick 121b of the transfer arm 71a or 71b), is installed to correspond to respective COR modules 61 and respective PHT modules 62.

The installation positions of the wafer detection mechanisms 80 are not limited to the illustrated example, and may be further provided to correspond to, for example, the load-lock modules 20a and 20b.

Figure 4:
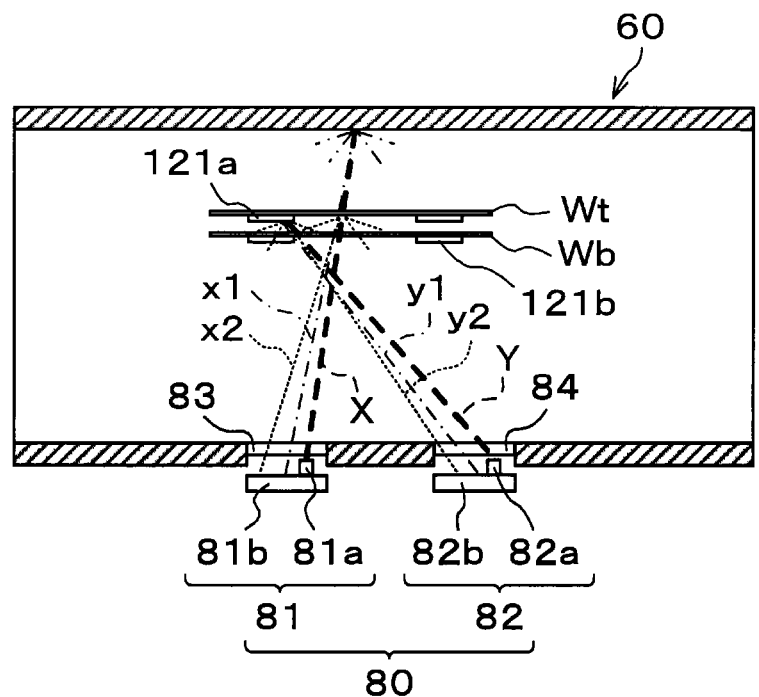
FIG. 4 is a vertical cross-sectional view schematically illustrating a configuration example of a wafer detection mechanism according to an embodiment.

As illustrated in FIG. 4, each wafer detection mechanism 80 includes an upper wafer detection sensor 81 configured to detect the upper wafer Wt mounted on the upper pick 121a and a lower wafer detection sensor 82 configured to detect the lower wafer Wb mounted on the lower pick 121b.

The upper wafer detection sensor 81 is constituted with, for example, a reflection-type distance measuring sensor having a light-projecting part 81a and a light-receiving part 81b, and is provided at the outer lower side of the housing constituting the transfer module 60. The upper wafer detection sensor 81 projects an optical axis (see an optical axis X in FIG. 4) to the ceiling surface of the transfer module 60 through a light transmission window 83 and detects a wafer W mounted on the transfer arm 71a based on the ceiling surface as a reference surface.

Specifically, the upper wafer detection sensor 81 detects whether a wafer W is mounted on the transfer arm 71a by detecting a difference between a light-receiving position at which a diffused and reflected light beam x1 is received by the light-receiving part 81b from the ceiling surface and a light-receiving position at which a diffused and reflected light beam x2 is received by the light-receiving part 81b from the wafer W when the optical axis X is projected from the light-projecting part 81a.

In addition, the upper wafer detection sensor 81 detects the presence/absence of a wafer W on the transfer arm 71a by detecting the light-receiving positions of the diffused and reflected light beams x1 and x2 from the ceiling surface and the wafer W in this way. However, when the light-receiving part 81b further receives a specularly reflected light beam in addition to the diffused and reflected light beams, the presence/absence of the wafer W on the transfer arm 71a may be erroneously detected. Specifically, since the wafer W, to which the optical axis X is projected, has a mirror surface, the projected optical axis X is specularly reflected from the wafer W. Then, when the specularly reflected light beam is further received by the light-receiving part 81b in addition to the diffused and reflected light beams, the difference between the light-receiving positions of the diffused and reflected light beams x1 and x2 cannot be appropriately detected, and thus the presence/absence of the wafer W may be erroneously detected.

Figure 5:
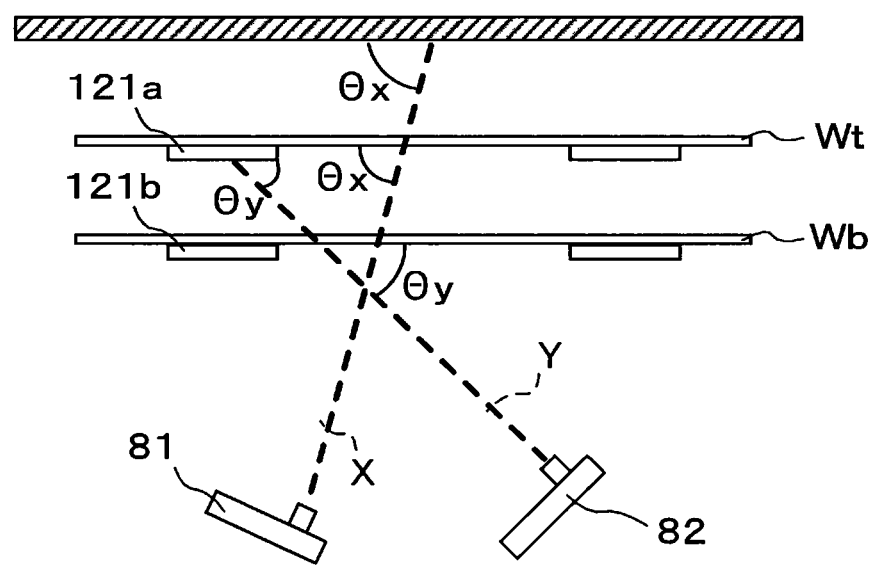
FIG. 5 is an explanatory view illustrating an example of installing the wafer detection mechanism.

Therefore, in this embodiment, the mounting angle of the upper wafer detection sensor 81, in other words, an incident angle θx of the optical axis X with respect to the surface to which the optical axis X is projected (in this embodiment, the inclination angle from the horizontal direction) as illustrated in FIG. 5, needs to be an angle that enables a part of the diffused and reflected light beams x1 and x2 from at least the ceiling surface of the transfer module 60 and the rear surface of the wafer W to be received by the light-receiving part 81b and that prevents the specularly reflected light beam from being received by the light-receiving part 81b. The incident angle θx is preferably 20 degrees or more and 70 degrees or less, and more preferably 30 degrees or more and 60 degrees or less. When the incident angle is smaller than 20 degrees, the diffused and reflected light beams x1 and x2 cannot be appropriately detected by the light-receiving part 81b. On the other hand, when the incident angle is larger than 70 degrees, the specularly reflected light beam from the wafer W may be received by the light-receiving part 81b, and the specularly reflected light beam may be erroneously detected as the diffused and reflected light beam x1 or x2.

The lower wafer detection sensor 82 is constituted with, for example, a reflection-type distance measuring sensor having a light-projecting part 82a and a light-receiving part 82b and is installed at the outer lower side of the housing constituting the transfer module 60. The lower wafer detection sensor 82 projects an optical axis (see the optical axis Y in FIGS. 3 and 4) to the rear surface of the upper pick 121a (the surface on which the upper wafer Wt is not held) through the light transmission window 84 and detects the wafer W on the lower pick 121b based on the rear surface of the upper pick 121a as a reference surface.

Specifically, the lower wafer detection sensor 82 determines whether the lower wafer Wb is mounted on the lower pick 121b by detecting a difference between a light-receiving position at which a diffused and reflected light beam y1 is received by the light-receiving part 82b from the rear surface of the upper pick 121a and a light-receiving position at which a diffused and reflected light y2 is received by the light-receiving part 82b from the rear surface of the upper pick 121a when the optical axis Y is projected from the light-projecting part 82a.

In addition, the mounting angle of the lower wafer detection sensor 82, in other words, the incident angle θy of the optical axis Y with respect to the surface to which the optical axis Y is projected (in this embodiment, the inclination angle from the horizontal direction) as illustrated in FIG. 5, is preferably 20 degrees or more and 70 degrees or less, and more preferably 30 degrees or more and 60 degrees or less, similarly to the upper wafer detection sensor 81.

In addition, the optical axis Y projected from the light-projecting part 82a of the lower wafer detection sensor 82 passes through the notch 122 formed at the inner end portion of the tip of the lower pick 121b as described above and is projected to the rear surface of the upper pick 121a.

The vacuum processing apparatus 1 described above is provided with a controller 90. The controller 90 is a computer including, for example, a CPU and a memory, and includes a program storage part (not illustrated). The program storage part stores programs for controlling wafer W processing in the vacuum processing apparatus 1. The program storage also stores a program for controlling the operation of the drive system of various processing modules or transfer mechanisms described above in order to implement wafer processing to be described later in the vacuum processing apparatus 1. The programs may be recorded in a computer-readable storage medium H, and may be installed on the controller 90 from the storage medium H.

The vacuum processing apparatus 1 according to this embodiment is configured as described above. Next, a wafer processing method including a substrate transfer method according to this embodiment will be described. FIG. 6 and FIGS. 7A to 7C are a flow chart and explanatory views illustrating the main steps of a method of transferring a wafer W from the transfer arms 71a and 71b of the wafer transfer mechanism 70 to various process modules. FIG. 8 and FIGS. 9A to 9C are a flow chart and explanatory views illustrating the main steps of a method of transferring a wafer W from various process modules to the transfer arms 71a and 71b of the wafer transfer mechanism 70.

<Wafer Processing Method>

First, a FOUP 31 containing a plurality of wafers W (e.g., 25 wafers of one lot) is carried into a load port 32. When the FOUP 31 is disposed in the load port 32, the wafer transfer mechanism 40 accesses the FOUP 31 and takes out two wafers W from the FOUP 31. The two wafers W carried out from the FOUP 31 are transferred to the stockers (not illustrated) in the load-lock module 20a, respectively, after the orientation in the horizontal direction is adjusted by the oriental module 34.

When the two wafers W are transferred to the load-lock module 20a, the interior of the load-lock module 20a is switched from the atmospheric pressure atmosphere to the decompression atmosphere and then communicates with the interior of the transfer module 60. Subsequently, the two wafers W are delivered to the upper pick 121a and the lower pick 121b of the transfer arm 71a in this order and carried into the transfer module 60.

When the wafers W are delivered from the load-lock module 20a to the transfer arm 71a, it may be detected whether or not the wafers W are properly delivered to the transfer arm 71a. In such a case, the method of detecting the delivery of the wafers W is not particularly limited and may be implemented using a detection sensor (not illustrated) provided inside the load-lock module 20a, or may be implemented by providing a wafer detection mechanism 80 corresponding to the load-lock module 20a, as described above. The details of the detection method implemented using the wafer detection mechanism 80 will be described later.

The wafer transfer mechanism 70 holding the two wafers W then moves to the front of one COR module 61. Subsequently, the two wafers W held by the transfer arm 71a are delivered from the upper pick 121a and the lower pick 121b to the stages 61a and 61b of the COR module 61, respectively.

When transferring the wafers W from the transfer arm 71a to the COR module 61, as described above, first, the wafer transfer mechanism 70 moves to a position for delivering the wafers W to and from the COR module 61 inside the transfer module 60 (which may be referred to as a "first initialization position" below) (step S1 in FIG. 6).

Figure 7A:
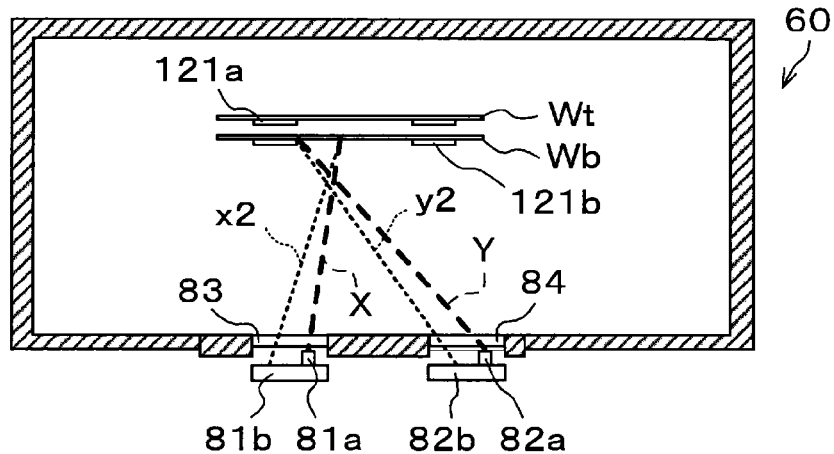
FIGS. 7A to 7C are explanatory views illustrating the main steps of the wafer transfer method according to an embodiment.

When the wafer transfer mechanism 70 moves to the first initialization position of the COR module 61, it is detected by the wafer detection mechanism 80, which is provided to correspond to the COR module 61, that the two wafers W are mounted on the transfer arm 71*a* of the wafer transfer mechanism 70 (step S2 in FIG. 6). Specifically, as illustrated in FIG. 7A, each of the optical axes X and Y, which are projected from the respective light-projecting parts 81*a* and 82*a* of the upper wafer detection sensor 81 and the lower wafer detection sensor 82, is diffused and reflected from the lower wafer Wb. As a result, the diffused and reflected light beams x2 and y2 are received by the light-receiving parts 81*b* and 82*b*, respectively, and it is detected that the lower wafer Wb is mounted on at least the lower pick 121*b* by detecting the light-receiving positions of the diffused and reflected light beams x2 and y2.

Here, as illustrated in FIG. 7A, the upper wafer detection sensor 81 detects that at least the lower wafer Wb is mounted on the transfer arm 71*a* by detecting the diffused and reflected light beam x2 from the lower wafer Wb of the optical axis X projected from the light-projecting part 81*a*. In other words, when both the upper wafer Wt and the lower wafer Wb are mounted on the transfer arm 71*a*, the optical axis X is reflected by the lower wafer Wb before reaching the upper wafer Wt. Thus, it is impossible to individually detect the mounting of the upper wafer Wt on the upper pick 121*a*. However, according to this embodiment, when the wafers W are delivered from the load-lock module 20*a* as described above, the upper wafer Wt is mounted on the upper pick 121*a* prior to the lower pick 121*b*. Further, as will be described later, when the wafers W is delivered to the process module, the lower wafer Wb is mounted on the lower pick 121*b* prior to the upper pick 121*a*. That is, according to the transfer method according to this embodiment, as illustrated in FIGS. 7A to 7C and FIGS. 9A to 9C described later, the wafer W transfer operation is controlled such that the state in which only the lower wafer Wb is held by the transfer arm 71*a* is not made and, when lower wafer Wb is held by the lower pick 121*b*, the upper wafer Wt is always held by the upper pick 121*a*. As a result, in this embodiment, even when the upper wafer detection sensor 81 cannot individually detect the mounting of the upper wafer Wt, it is possible to detect that the upper wafer Wt is mounted on the upper pick 121*a* in a pseudo manner.

Next, the lower pick 121*b* of the transfer arm 71*a* accesses the COR module 61, and the lower wafer Wb is delivered from the lower pick 121*b* to the COR module 61 (step S3 in FIG. 6).

Figure 7B:
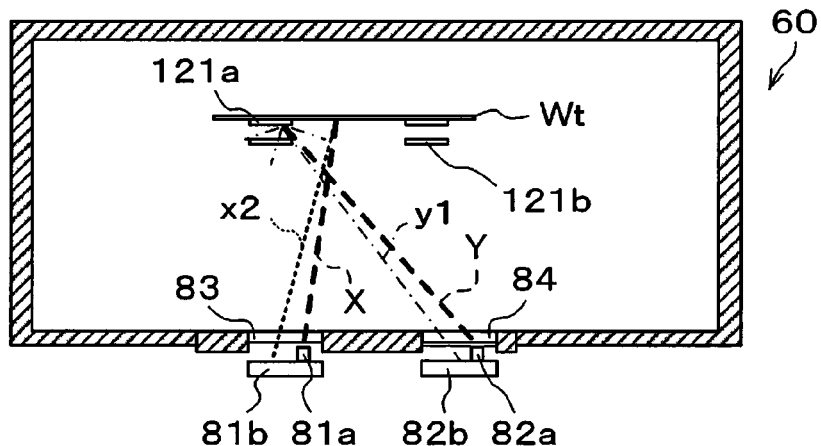

When the lower wafer Wb is delivered from the lower pick 121*b*, the lower wafer detection sensor 82 detects whether or not the lower wafer Wb has been appropriately delivered from the lower pick 121*b* to the COR module 61 (step S4 in FIG. 6). Specifically, as illustrated in FIG. 7B, since at least a part of the diffused and reflected light y1 from the rear surface of the upper pick 121*a* of the optical axis Y projected from the light-projecting part 82*a* of the lower wafer detection sensor 82 is received by the light-receiving part 82*b*, it is detected that the lower wafer Wb is not held by the lower pick 121*b*, that is, the lower wafer Wb has been appropriately delivered to the COR module 61.

At the time of detecting the delivery of the lower wafer Wb (step S4), it may be detected at the same time that the upper wafer Wt is reliably held by the upper pick 121*a*. As described above, when the lower wafer Wb is mounted on the lower pick 121*b*, the upper wafer detection sensor 81 cannot directly detect the upper wafer Wt on the upper pick 121*a*. Therefore, by confirming the reception of the diffused and reflected light beam x2 by the light-receiving part 81*b* at the time at which the lower wafer Wb is delivered to the COR module 61, it can be appropriately detected that the upper wafer Wt is mounted on the upper pick 121*a* based on the difference from the light-receiving position of the diffused and reflected light beam x1.

When the lower wafer Wb is delivered to the COR module 61, the upper pick 121*a* of the transfer arm 71*a* then accesses the COR module 61, and the upper wafer Wt is delivered from the upper pick 121*a* (step S5 in FIG. 6).

Figure 7C:
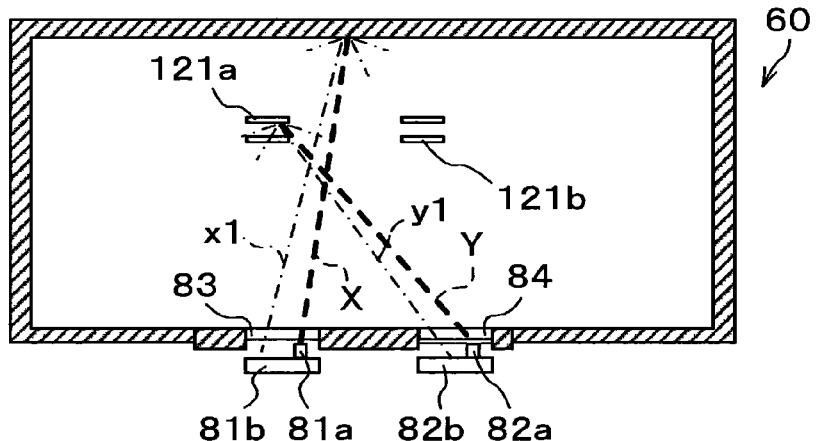

When the upper wafer Wt is delivered from the upper pick 121*a*, the upper wafer detection sensor 81 detects whether or not the upper wafer Wt has been appropriately delivered from the upper pick 121*a* to the COR module 61 (step S6 in FIG. 6). Specifically, as illustrated in FIG. 7C, since at least a part of the diffused and reflected light beam x1 from the ceiling surface of the transfer module 60 of the optical axis X projected from the light-projecting part 81*a* of the upper wafer detection sensor 81 is received by the light-receiving part 81*b*, it is detected that the upper wafer Wt is not held by the upper pick 121*a*, that is, the upper wafer Wt has been appropriately delivered to the COR module 61.

When the two wafers W are placed on the stages 61*a* and 61*b* of the COR module 61, respectively, the gate valve (not illustrated) of the COR module 61 is closed and the two wafers W are subjected to COR processing.

When the COR processing by the COR module 61 is completed, the gate valve (not illustrated) is opened, and the two wafers W are delivered from the respective stages 61*a* and 61*b* of the COR module 61 to the transfer arm 71*a* of the wafer transfer mechanism 70.

When transferring the wafers W from the transfer arm 71*a* to the COR module 61, first, the wafer transfer mechanism 70 moves to the first initialization position for delivering the wafers W to and from the COR module 61 inside the transfer module 60 (step P1 in FIG. 8).

Figure 9A:
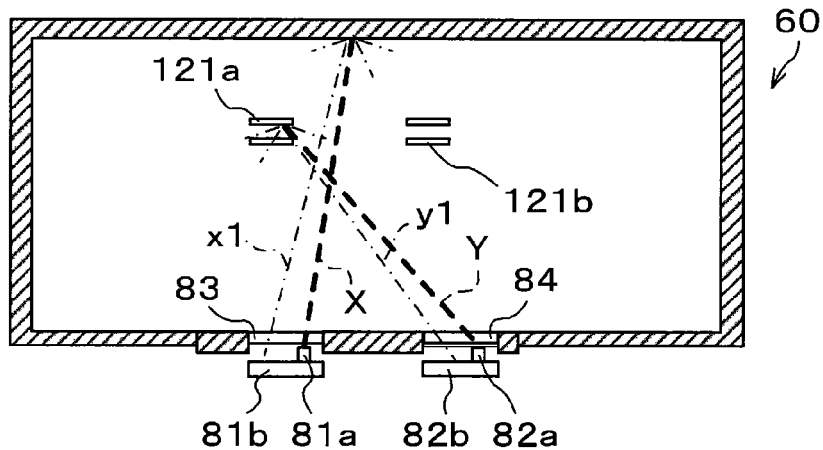
FIGS. 9A to 9C are explanatory views illustrating the main steps of the wafer transfer method according to an embodiment.

When the wafer transfer mechanism 70 moves to the first initialization position of the COR module 61, it is detected by the wafer detection mechanism 80, which is provided to correspond to the COR module 61, that the wafers W are not mounted on the transfer arm 71*a* of the wafer transfer mechanism 70 (step P2 in FIG. 8). Specifically, as illustrated in FIG. 9A, the optical axes X and Y, which are projected from the respective light-projecting parts 81*a* and 82*a* of the upper wafer detection sensor 81 and the lower wafer detection sensor 82, are diffused and reflected from the ceiling surface of the transfer module 60 and the rear surface of the upper peak 121*a*, respectively. As a result, at least a part of the diffused and reflected light beams x1 and y1 is received by the light-receiving parts 81*b* and 82*b*, and based thereon, it is detected that the wafers W are not mounted on the transfer arm 71*a*.

Next, the upper pick 121*a* of the transfer arm 71*a* accesses the COR module 61, and the upper wafer Wt is delivered to the upper pick 121*a* (step P3 in FIG. 8).

Figure 9B:
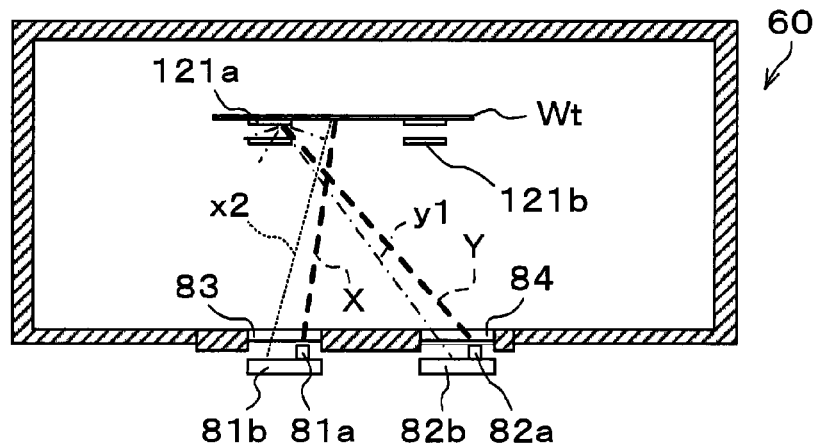

When the upper wafer Wt is delivered to the upper pick 121*a*, the upper wafer detection sensor 81 detects whether or not the upper wafer Wt has been appropriately delivered to the upper pick 121*a* (step P4 in FIG. 8). Specifically, as illustrated in FIG. 9B, by detecting that the light-receiving position of the diffused and reflected light beam x1, which was received by the light-receiving part 81*b* from the ceiling surface of the transfer module 60, has been changed to the light-receiving position of the diffused and reflected light beam x2 from the upper wafer Wt due to the mounting of the upper wafer Wt, it is detected that the upper wafer Wt has been delivered to the upper pick 121a.

When the upper wafer Wt is delivered to the upper pick 121a, the lower pick 121b of the transfer arm 71a then accesses the COR module 61, and the lower wafer Wb is delivered to the lower pick 121b (step P5 in FIG. 8).

Figure 9C:
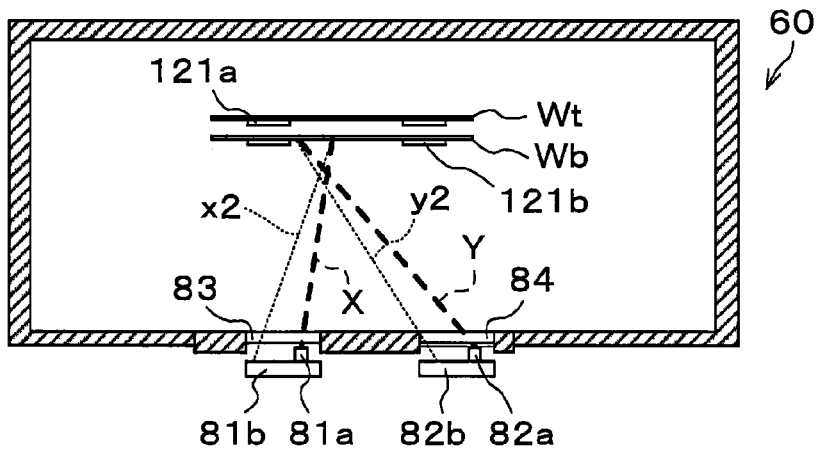

When the lower wafer Wb is delivered to the lower pick 121b, the lower wafer detection sensor 82 detects whether or not the lower wafer Wb has been appropriately delivered to the lower pick 121b (step P6 in FIG. 8). Specifically, as illustrated in FIG. 9C, by detecting that the light-receiving position of the diffused and reflected light beam y1, which was received by the light-receiving part 82b from the rear surface of the upper pick 121a, has been changed to the light-receiving position of the diffused and reflected light beam y2 from the lower wafer Wb due to the mounting of the lower wafer Wb, it is detected that the lower wafer Wb has been delivered to the lower pick 121b.

When the two wafers W are delivered to the transfer arm 71a, the wafer transfer mechanism 70 is then moved to the first initialization position of one PHT module, and then the two wafers W are transferred to the stages 62a and 62b of the PHT module 62, respectively.

The method of delivering the wafers W to the PHT module 62 is the same as the method of delivering the wafers W to the COR module 61 illustrated in FIG. 6 and FIGS. 7A to 7C. That is, after the wafer transfer mechanism 70 moves to the first initialization position of the PHT module 62 (step S1 in FIG. 6) and the holding state of the wafers W is confirmed as described above (step S2 in FIG. 6), each of the lower pick 121b and the upper pick 121a accesses the PHT module 62 in this order, and the lower wafer Wb and the upper wafer Wt are delivered (steps S3 and S5 in FIG. 6). At this time, it is detected whether or not the lower wafer Wb and the upper wafer Wt have been appropriately delivered from the lower pick 121b and the upper pick 121a (steps S4 and S6 in FIG. 6).

When the two wafers W are placed on the stages 62a and 62b of the PHT module 62, respectively, the gate valve (not illustrated) of the PHT module 62 is closed and the two wafers W are subjected to PHT processing.

When the PHT processing by the PHT module 62 is completed, the gate valve (not illustrated) is opened, and the two wafers W are delivered from the respective stages 62a and 62b of the PHT module 62 to the transfer arm 71b of the wafer transfer mechanism 70.

The method of delivering the wafers W from the PHT module 62 to the transfer arm 71b is the same as the method of delivering the wafers W from the COR module 61 to the transfer arm 71a illustrated in FIG. 8 and FIGS. 9A to 9C. That is, after the wafer transfer mechanism 70 moves to the first initialization position of the PHT module 62 (step P1 in FIG. 8) and the holding state of the wafers W is confirmed as described above (step P2 in FIG. 8), each of the upper pick 121a and the lower pick 121b accesses the PHT module 62 in this order, and the upper wafer Wt and the lower wafer Wb are delivered (steps P3 and P5 in FIG. 8). At this time, it is detected whether or not the upper wafer Wt and the lower wafer Wb have been appropriately delivered from the upper pick 121a and the lower pick 121b (steps P4 and P6 in FIG. 8).

Thereafter, the gate valve (not illustrated) of the load-lock module 20b is opened, and the two wafers W are transferred to the stockers (not illustrated) of the load-lock module 20b by the wafer transfer mechanism 70.

When the two wafers W are transferred to the load-lock module 20b, the interior of the load-lock module 20b is switched from the atmospheric pressure atmosphere to the decompression atmosphere and then communicates with the interior of the loader module 30. Subsequently, the two wafers W are delivered to the wafer transfer mechanism 40, cooled by the CST module 33, and then accommodated in the FOUP 31 in the load port 32. In this way, a series of wafer processing processes in the vacuum processing apparatus 1 are completed.

Effect of Substrate Detection Method According to this Embodiment

As described above, the transfer module 60 according to this embodiment includes reflection-type distance measuring sensors as the upper wafer detection sensor 81 and the lower wafer detection sensor 82 for detecting the wafers W mounted on the transfer arms 71a and 71b of the wafer transfer mechanism 70. As a result, compared with the case in which a transmissive sensor, which is also disclosed in Patent Document 1, is used as a wafer detection mechanism, it is possible to omit the space for install the wafer detection mechanism. Specifically, unlike the transmissive sensor, since it is not necessary to provide a light-projecting part and a light-receiving part of an optical axis to face each other, it is possible to reduce the difficulty of spatial restrictions according to the installation of the wafer detection mechanism.

Figure 10A:
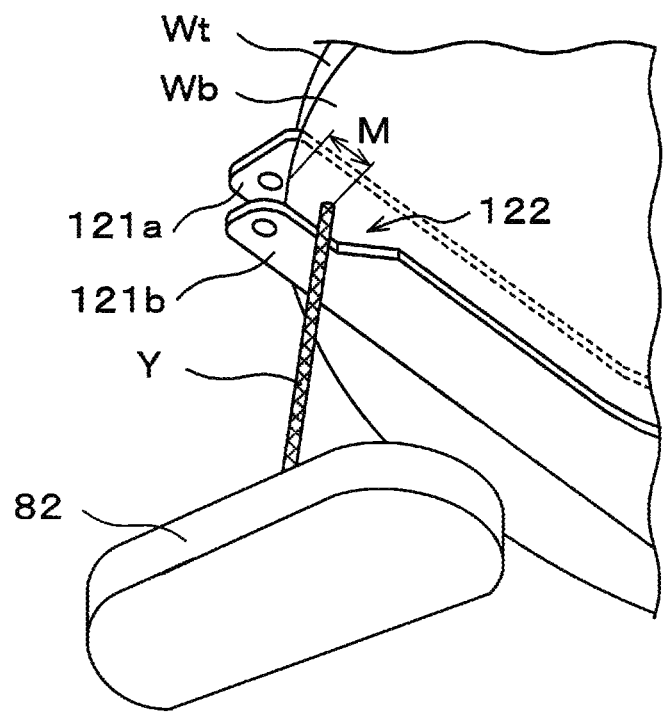
FIGS. 10A and 10B are explanatory views illustrating an effect of the notch formed in the lower pick.
Figure 10B:
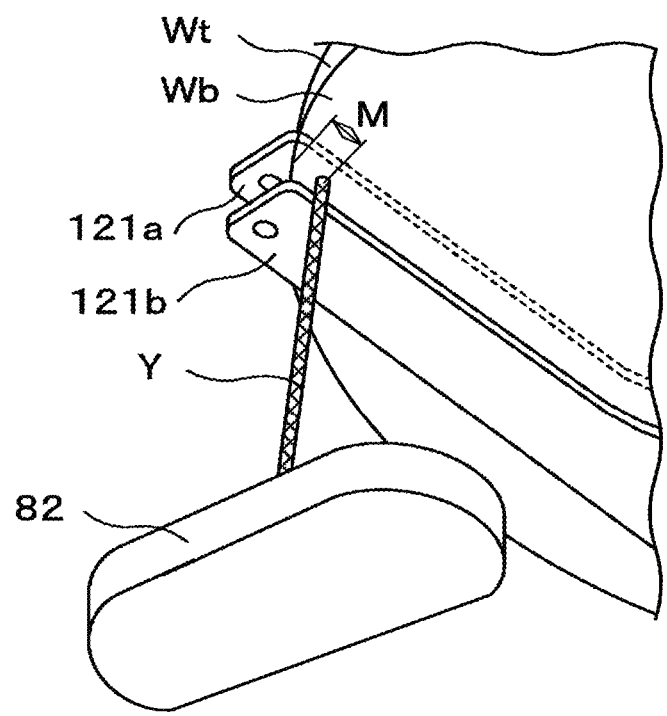

In addition, according to this embodiment, a notch 122 that allows the optical axis Y projected from the lower wafer detection sensor 82 to pass therethrough is formed at an inner end portion of the tip of the lower pick 121b configured to hold the lower wafer Wb. As a result, as illustrated in FIGS. 10A and 10B, compared with a case in which no notch 122 is formed, a margin M between an outer end portion We of the lower wafer Wb mounted on the lower pick 121b and the central portion of the optical axis Y can be set longer.

As described above, regarding the lower wafer Wb mounted on the lower pick 121b, the presence/absence of the lower wafer Wb is detected by detecting a difference in the light-receiving position on the light-receiving part 82b between a diffused and reflected light beam y1 from the rear surface of the upper pick 121a and a diffused and reflected light beam y2 from the lower wafer Wb when the optical axis Y is projected from the lower wafer detection sensor 82. Here, when the lower wafer Wb is mounted to be misaligned with respect to the lower pick 121b, or when the mounting position is misaligned during the transfer of the lower wafer Wb, the lower wafer detection sensor 82 may erroneously determine the presence/absence of the lower wafer Wb. Specifically, when the lower wafer Wb is mounted to be misaligned with respect to the lower pick 121b, the optical axis Y is not appropriately projected to the lower wafer Wb. Thus, even when the lower wafer Wb is mounted, the diffused and reflected light beam y1 from the rear surface of the upper pick 121a may be received.

In this regard, according to this embodiment, by setting the reference surface of the optical axis Y of the lower wafer detection sensor 82 to the rear surface of the upper pick 121a, and forming a notch 122 at the inner end portion of the tip of the lower pick 121b, the margin M between the outer end portion of the lower wafer Wb and the central portion of the optical axis Y can be set long. In other words, since it is possible to set the range of erroneous detection for the displacement of the lower wafer Wb to be small (the range in which the optical axis Y can be projected to the lower wafer Wb to be large), it is possible to improve the reliability for the misalignment of the lower wafer Wb during transfer.

In this embodiment, the mounting angles of the upper wafer detection sensor 81 and the lower wafer detection sensor 82, in other words, the incident angles θx and θy of the optical axes X and Y with respect to the surface to which the optical axes X and Y are projected, are set to an angle that enables a part of the diffused and reflected light beams x1 and y1 from at least the ceiling surface of the transfer module 60 and the rear surface of the upper pick 121a to be received by the light-receiving parts 81b and 82b and that prevents a specularly reflected light beam from the wafer W from being received by the light-receiving parts 81b and 82b. This makes it possible for the light-receiving parts 81b and 82b to appropriately detect the difference in light-receiving position between the diffused and reflected light beams x1 and y1 and the diffused and reflected light beams x2 and y2, that is, the presence/absence of a wafer W on the transfer arm appropriately.

In the embodiments described above, the wafer detection mechanism 80 (the upper wafer detection sensor 81 and lower wafer detection sensor 82) is provided at the outer lower side of the transfer module 60, but the installation position of the wafer detection mechanism 80 is not limited thereto.

Figure 11:
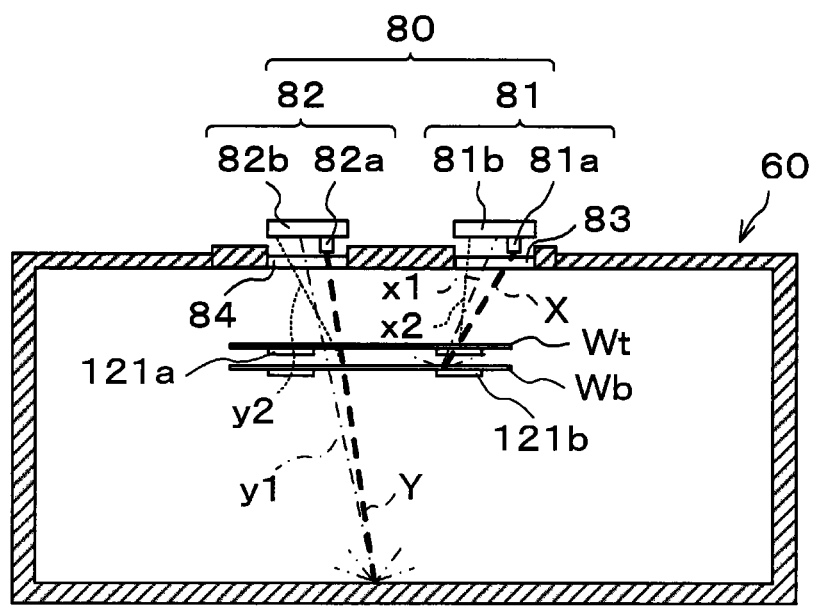
FIG. 11 is an explanatory view illustrating another configuration example of the wafer detection mechanism.

Specifically, for example, as illustrated in FIG. 11, each of the upper wafer detection sensor 81 and the lower wafer detection sensor 82 may be provided above at the outer upper side of the transfer module 60. In such a case, for example, the upper wafer detection sensor 81 may project the optical axis X based on the top surface of the lower pick 121b as a reference surface, and the lower wafer detection sensor 82 may project the optical axis Y based on the bottom surface of the transfer module 60 as a reference surface. In such a case, a notch 122 may be formed at the inner end of the tip of the upper pick 121a in order to improve the reliability for the misalignment of the upper wafer Wt during transfer.

In the case in which each of the upper wafer detection sensor 81 and the lower wafer detection sensor 82 is provided at the outer upper side of the transfer module 60 as described above, when both the upper wafer Wt and the lower wafer Wb are mounted on the transfer arm 71a, it is impossible to individually detect the mounting of the lower wafer Wb on the lower pick 121b since the optical axis Y is specularly reflected by the upper wafer Wt before reaching the lower wafer Wb. From this point of view, in the case in which the upper wafer detection sensor 81 and the lower wafer detection sensor 82 are provided at the outer upper side of the transfer module 60, it is preferable to control the wafer W transfer operation such that the state in which the transfer arm 71a holds only the upper wafer Wt is not made and when the upper wafer Wt is held by the upper pick 121a, the lower wafer Wb is always held by the lower pick 121b. As a result, even when the lower wafer detection sensor 82 cannot individually detect the mounting of the lower wafer Wb, it is possible to detect that the lower wafer Wb is mounted on the lower pick 121b in a pseudo manner.

Figure 12:
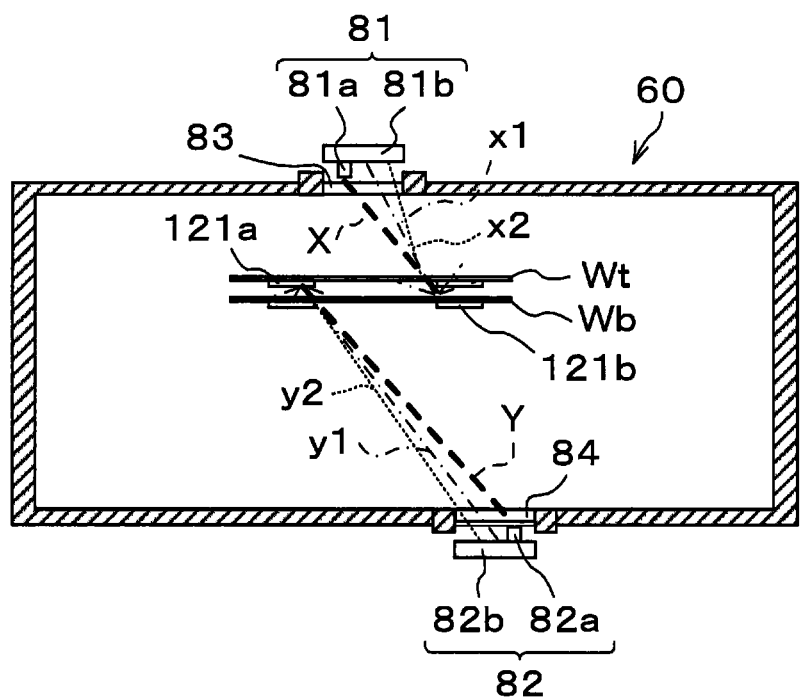
FIG. 12 is an explanatory view illustrating another configuration example of the wafer detection mechanism.

In addition, for example, as illustrated in FIG. 12, the upper wafer detection sensor 81 and the lower wafer detection sensor 82 may be provided at the outer upper side of the transfer module 60 and the outer lower side of the transfer module 60, respectively. In such a case, for example, the upper wafer detection sensor 81 may project the optical axis X based on the top surface of the lower pick 121b as a reference surface, and the lower wafer detection sensor 82 may project the optical axis Y based on the rear surface of the upper pick 121a as a reference surface. In addition, in such a case, a notch 122 may be formed at the inner end of the tip of each of the upper pick 121a and the lower pick 121b in order to improve the reliability for the misalignment of the upper wafer Wt and the lower wafer Wb during transfer.

In the embodiments described above, both the upper wafer detection sensor 81 and the lower wafer detection sensor 82 are constituted with reflection-type distance measuring sensors, but one of the upper wafer detection sensor 81 and the lower wafer detection sensor 82 may be constituted with another type of detection sensor.

Figure 13:
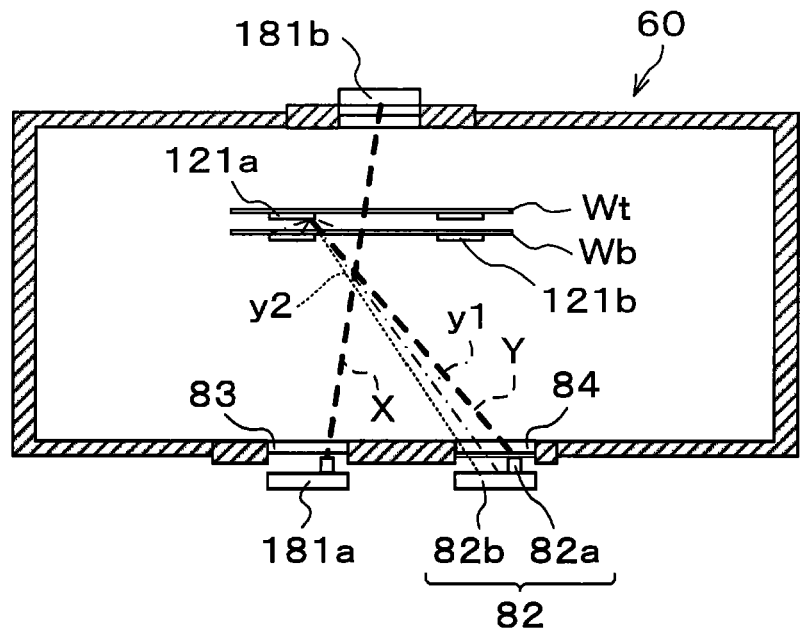
FIG. 13 is an explanatory view illustrating another configuration example of the wafer detection mechanism.

Specifically, for example, as illustrated in FIG. 13, the upper wafer detection sensor 181 may be constituted with a transmission-type sensor, and the lower wafer detection sensor 82 may be constituted with a reflection-type distance measuring sensor. In such a case, the upper wafer detection sensor 181, which is a transmission-type sensor, detects that no wafer W is mounted on the transfer arm 71a when the optical axis X projected from the light-projecting part 181a is received by the light-receiving part 181b. On the other hand, when the optical axis X is blocked by a wafer W and is not received by the light-receiving part 181b, the upper detection sensor detects that at least the wafer W is mounted on the transfer arm 71a.

As described above, by constituting at least one of the upper wafer detection sensor 81 and the lower wafer detection sensor 82 of the wafer detection mechanism 80 using a reflection-type distance measuring sensor, it is possible to individually specify and detect a plurality of wafers W mounted on the transfer arm. Furthermore, the spatial restrictions according to the installation of the wafer detection mechanism are reduced compared with the case in which transmission-type sensors are only used as the wafer detection mechanism. At this time, by setting the reference surface to which the optical axis is projected from the reflection-type distance measuring sensor to either the upper pick 121a or the lower pick 121b and forming the notch 122 in the other pick, the reliability of the wafer detection mechanism for the misalignment of the wafers W can be improved.

In the embodiments described above, the wafer detection mechanism 80 detects the presence/absence of a mounted wafer W (wafer detection operation) when carrying wafers W mounted on the transfer arms 71a and 71b into/out of the process module. However, the time at which the wafer detection operation is performed is not limited to the embodiments described above. For example, the wafer detection mechanism 80 may detect the presence/absence of a wafer W mounted on the transfer arms 71a and 71b (initialization operation) when the holding state of wafers W on the transfer arms 71a and 71b becomes unknown due to an emergency stop of the vacuum processing apparatus 1 or the like.

Figure 14:
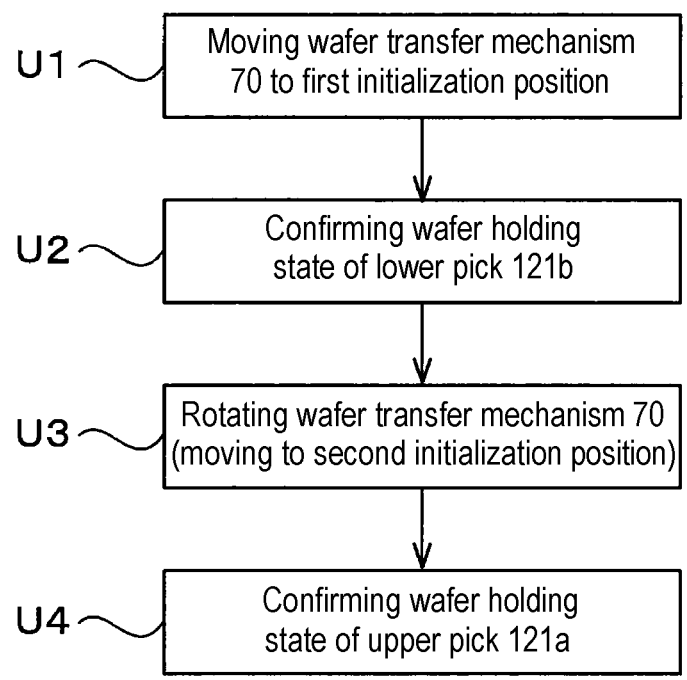
FIG. 14 is a flowchart illustrating main steps of an initialization operation of the wafer transfer mechanism.
Figure 15A:
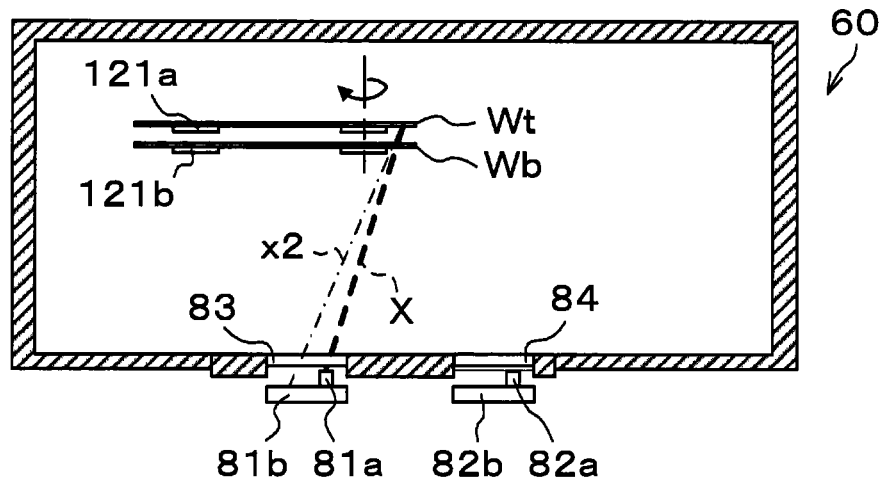
FIGS. 15A and 15B are explanatory views schematically illustrating an operation example in the initialization operation of the wafer transfer mechanism.
Figure 15B:
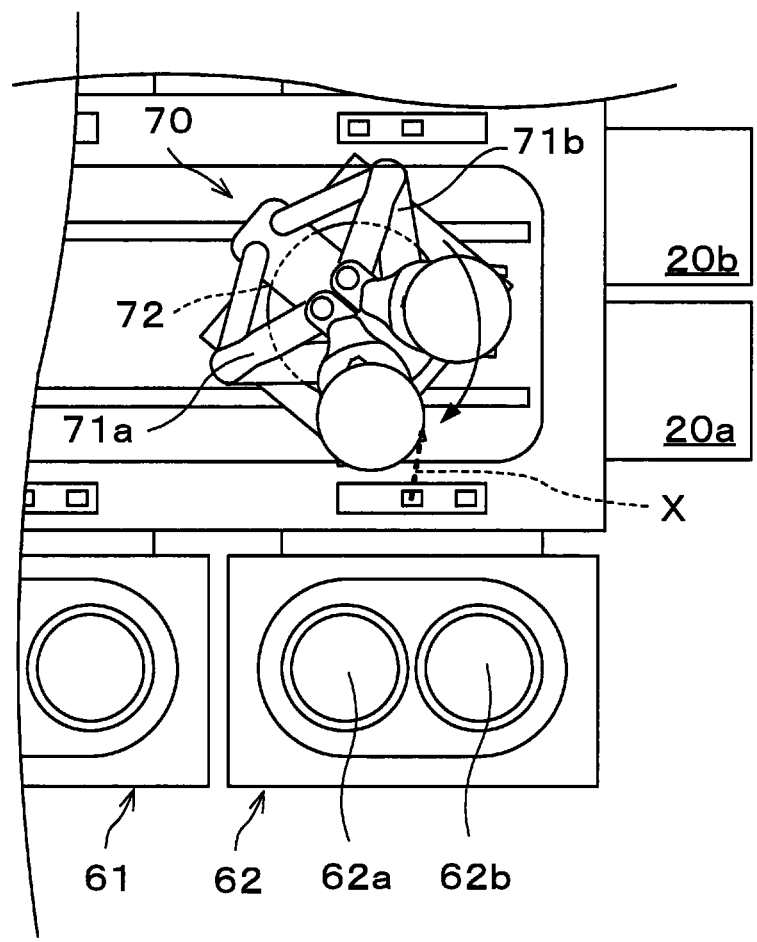

FIG. 14 and FIGS. 15A and 15B are a flow chart and explanatory views illustrating the main steps of an initialization operation of the wafer transfer mechanism 70. In the following description, a case in which the wafer transfer mechanism 70 is initialized at the first initialization position of one PHT module 62 will be described as an example, but the initialization operation can be performed at the first initialization position of any process module if a "second initialization position" to be described later can be set. Further, in the following description, the case of performing the initialization operation of the transfer arm 71a (confirmation of the holding state of a wafer W) will be described as an example, but the method of initializing the transfer arm 71b is implemented in the same manner as the initialization operation of the transfer arm 71a.

In the initialization operation of the wafer transfer mechanism 70, first, the wafer transfer mechanism 70 in which the holding state of the wafer W on the transfer arm 71a is unknown is moved to the first initialization position of one PHT module 62 (step U1 in FIG. 14).

Next, using the lower wafer detection sensor 82 of the wafer detection mechanism 80 provided to correspond to the PHT module 62, it is detected whether or not the lower wafer Wb is held on the lower pick 121b of the transfer arm 71a (step U2 in FIG. 14). Specifically, the light-projecting part 82a projects an optical axis Y to the rear surface of the upper pick 121a, and it is determined whether or not the lower wafer Wb is mounted based on a difference between a light-receiving position at which a diffused and reflected light beam y1 is received by the light-receiving part 82b from the rear surface of the upper pick 121a serving as a reference and a light-receiving position at which a diffused and reflected light beam y2 is received by the light-receiving part 82b from the rear surface of the lower wafer Wb. More specifically, when the diffused and reflected light beam y1 is detected at the reference light-receiving position, it is determined that the lower wafer Wb is not mounted, and when the diffused and reflected light beam y2 is detected at a position deviated from the reference light-receiving position, it is determined that the lower wafer Wb is mounted.

Next, it is detected whether or not the upper wafer Wt is held on the upper pick 121a of the transfer arm 71a using the upper wafer detection sensor 81 of the wafer detection mechanism 80.

As described above, when both the upper wafer Wt and the lower wafer Wb are normally mounted on the transfer arm 71a, the optical axis X is specularly reflected by the lower wafer Wb before reaching the upper wafer Wt, it is impossible to individually detect the mounting of the upper wafer Wt on the upper pick 121a.

Therefore, in the initialization operation according to this embodiment, the wafer transfer mechanism 70 is rotated around the vertical axis by the operation of the turntable 72 or the transfer arm 71a (step U3 in FIG. 14). By rotating the wafer transfer mechanism 70 around the vertical axis in this way, as illustrated in FIG. 15, the wafer transfer mechanism 70 reaches a position at which the optical axis X projected from the upper wafer detection sensor 81 does not hit the lower wafer Wb, but is projected to the upper wafer Wt (hereinafter, referred to as a "second initialization position").

When the wafer transfer mechanism 70 is moved to the second initialization position, next, it is detected whether or not the upper wafer Wt is held on the upper pick 121a of the transfer arm 71a (step U4 in FIG. 14). Specifically, the light-projecting part 81a projects an optical axis X to the ceiling surface of the transfer module 60, and it is determined whether or not the upper wafer Wt is mounted based on a difference between a light-receiving position at which a diffused and reflected light beam x1 is received by the light-receiving part 81b from the ceiling surface serving as a reference and a light-receiving position at which a diffused and reflected light beam x2 is received by the light-receiving part 81b from the rear surface of the upper wafer Wt. More specifically, when the diffused and reflected light beam x1 is detected at the reference light-receiving position, it is determined that the upper wafer Wt is not mounted, and when the diffused and reflected light beam x2 is detected at a position deviated from the reference light-receiving position, it is determined that the upper wafer Wt is mounted.

As described above, in the vacuum processing apparatus 1 according to this embodiment, the wafer transfer mechanism 70 can be moved to the second initial position at which the optical axis X does not hit the lower wafer Wb, but is projected to the upper wafer Wt by rotating the wafer transfer mechanism 70 around the vertical axis at the first initialization position of the one process module. As a result, even when the holding state of the wafers W on the transfer arms 71a and 71b is unknown, it is possible to individually detect whether or not the wafers W are appropriately mounted on the upper pick 121a and the lower pick 121b, respectively.

In addition, the vacuum processing apparatus 1 according to this embodiment is different from a conventional vacuum processing apparatus in that the wafer transfer mechanism 70 has two initialization positions as described above. That is, in the conventional vacuum processing apparatus, the wafer transfer mechanism 70 has only one initialization for transferring and detecting wafers W at the above-mentioned first initialization position, but, in this embodiment, the second initialization position for individually detecting the upper wafer Wt is set.

For example, when, in the detecting the wafer holding state of the lower pick 121b illustrated in step U2 of FIG. 14, it is determined that the lower wafer Wb is not mounted on the lower pick 121b, it is not always necessary to move the wafer transfer mechanism 70 to the second initialization position in the detecting the upper wafer Wt in step U3. That is, since the lower wafer Wb is not mounted on the lower pick 121b, it is possible to directly detect the optical axis X projected from the upper wafer detection sensor 81 with respect to the upper wafer Wt without moving the wafer transfer mechanism 70 to the second initialization position.

The configuration of the vacuum processing apparatus 1 to which the wafer W transfer method (detection method) according to the technique of the present disclosure is applied is not limited to the above-described embodiments. That is, the wafer W transfer method (detection method) according to the present disclosure is applicable to any processing system as long as a plurality of wafers W are simultaneously transferred and processed by a wafer transfer mechanism.

It should be understood that the above-described embodiments disclosed herein are exemplary in all respects and are not restrictive. The above-described embodiments may be omitted, replaced, or modified in various forms without departing from the scope and spirit of the appended claims.

With the technique according to the present disclosure, in a transfer apparatus configured to simultaneously transfer a plurality of substrates, the substrates held by the transfer apparatus can be appropriately detected.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A transfer apparatus that transfers a first substrate and a second substrate while holding the first substrate and the second substrate to overlap each other in a vertical direction, the transfer apparatus comprising:

a first holding arm configured to hold the first substrate in a horizontal direction;
a second holding arm configured to hold the second substrate in the horizontal direction;
a first detection sensor configured to detect presence/absence of the first substrate held by the first holding arm; and
a second detection sensor configured to detect presence/absence of the second substrate held by the second holding arm,
wherein the first detection sensor and the second detection sensor are arranged in one side of the first holding arm in the vertical direction,
wherein the second holding arm is arranged in the other side of the first holding arm in the vertical direction,
wherein at least the first detection sensor includes a sensor configured to detect the presence/absence of the first substrate by projecting an optical axis based on the second holding arm as a reference surface and detecting a difference in a light-receiving position between a diffused and reflected light beam from the reference surface and a diffused and reflected light beam from a substrate,
wherein the first holding arm includes a notch formed at least at an inner end portion of a tip of the first holding arm and configured to allow the optical axis projected to the second holding arm to pass therethrough, and
wherein the second detection sensor is configured to detect the presence/absence of the second substrate by projecting an optical axis based on an inner wall surface of a housing of the transfer apparatus as a reference surface.

2. The transfer apparatus of claim 1, wherein an inclination angle of the optical axis projected from the first detection sensor with respect to the horizontal direction is set to an angle that enables the diffused and reflected light from the reference surface to be received by a light-receiving part and that prevents a specularly reflected light from the first substrate from being received by the light-receiving part.

3. The transfer apparatus of claim 2, wherein the inclination angle is 20 degrees or more and 70 degrees or less.

4. The transfer apparatus of claim 3, wherein at least one of the first detection sensor and the second detection sensor is constituted with a reflection-type distance measuring sensor.

5. The transfer apparatus of claim 3, wherein the inclination angle is 30 degrees or more and 60 degrees or less.

6. The transfer apparatus of claim 1, wherein at least one of the first detection sensor and the second detection sensor is constituted with a reflection-type distance measuring sensor.

7. The transfer apparatus of claim 1, wherein the second detection sensor is constituted with a transmission-type sensor.

8. A method of transferring a substrate in a transfer apparatus that transfers a first substrate and a second substrate while holding the first substrate and the second substrate to overlap each other in a vertical direction,
wherein the transfer apparatus includes:
a first holding arm configured to hold the first substrate in a horizontal direction;
a second holding arm disposed above the first holding arm and configured to hold the second substrate in the horizontal direction;
a first detection sensor configured to detect presence/absence of the first substrate held by the first holding arm; and
a second detection sensor configured to detect presence/absence of the second substrate held by the second holding arm,
wherein the first detection sensor and the second detection sensor are arranged in one side of the first holding arm in the vertical direction,
wherein the second holding arm is arranged in the other side of the first holding arm in the vertical direction,
wherein at least the first detection sensor includes a sensor configured to detect the presence/absence of the first substrate by projecting an optical axis based on the second holding arm as a reference surface and detecting a difference in a light-receiving position between a diffused and reflected light beam from the reference surface and a diffused and reflected light beam from the substrate,
wherein the second detection sensor is configured to detect the presence/absence of the second substrate by projecting an optical axis based on an inner wall surface of a housing of the transfer apparatus as a reference surface, and
wherein the method comprises:
delivering the first substrate held by the first holding arm to and from a processing apparatus attached to the transfer apparatus;
confirming a holding state of the first substrate by the first holding arm using the first detection sensor;
delivering the second substrate held by the second holding arm to and from the processing apparatus; and
confirming a holding state of the second substrate by the second holding arm using the second detection sensor.

9. The method of claim 8, wherein the first holding arm includes a notch at least at an inner end portion of a tip of the first holding arm, and
when detecting the first substrate using the first detection sensor, the optical axis projected from the first detection sensor is projected to the second holding arm to pass through the notch.

10. The method of claim 9, wherein, when the first substrate and the second substrate are carried into the processing apparatus, the first substrate is carried in before the second substrate is carried in, and
when the first substrate and the second substrate are carried out from the processing apparatus, the first substrate is carried out before the second substrate is carried out.

11. The method of claim 10, wherein at least one of the first detection sensor and the second detection sensor is constituted with a reflection-type distance measuring sensor.

12. The method of claim 8, wherein, when the first substrate and the second substrate are carried into the processing apparatus, the first substrate is carried before the second substrate is carried in, and
when the first substrate and the second substrate are carried out from the processing apparatus, the first substrate is carried out before the second substrate is carried out.

13. The method of claim 8, wherein at least one of the first detection sensor and the second detection sensor is constituted with a reflection-type distance measuring sensor.

* * * * *